US 008169251B2

(12) United States Patent
Cheng

(10) Patent No.: US 8,169,251 B2
(45) Date of Patent: May 1, 2012

(54) CAPACITOR INTERFACE CIRCUIT

(75) Inventor: Ping-Pao Cheng, Hsinchu County (TW)

(73) Assignee: ITE Tech. Inc., Hsinchu (TW)

( * ) Notice: Subject to any disclaimer, the term of this patent is extended or adjusted under 35 U.S.C. 154(b) by 225 days.

(21) Appl. No.: 12/490,306

(22) Filed: Jun. 23, 2009

(65) Prior Publication Data

US 2010/0253368 A1  Oct. 7, 2010

(30) Foreign Application Priority Data

Apr. 7, 2009  (TW) ................................ 98111490 A

(51) Int. Cl.
*G06F 7/64* (2006.01)
(52) U.S. Cl. ............... 327/337; 327/91; 327/94; 327/95; 324/658; 324/679
(58) Field of Classification Search .................. 327/91, 327/94–95, 337; 324/658, 679
See application file for complete search history.

(56) References Cited

U.S. PATENT DOCUMENTS

| | | | | |
|---|---|---|---|---|
| 5,072,219 A * | 12/1991 | Boutaud et al. | ................. | 341/150 |
| 5,281,860 A * | 1/1994 | Krenik et al. | ................. | 327/407 |
| 5,563,597 A * | 10/1996 | McCartney | ................. | 341/150 |
| 6,323,801 B1 * | 11/2001 | McCartney et al. | .......... | 341/172 |
| 6,351,506 B1 * | 2/2002 | Lewicki | ......................... | 375/350 |
| 6,437,720 B1 * | 8/2002 | Yin et al. | ....................... | 341/150 |
| 6,617,908 B1 * | 9/2003 | Thomsen et al. | .............. | 327/337 |
| 6,727,836 B2 * | 4/2004 | Jeng | .............................. | 341/150 |
| 7,061,413 B2 * | 6/2006 | Boemler | ....................... | 341/120 |
| 7,161,520 B2 * | 1/2007 | Liu et al. | ......................... | 341/155 |
| 7,235,983 B2 | 6/2007 | O'Dowd et al. | | |
| 7,304,483 B2 * | 12/2007 | O'Dowd et al. | .............. | 324/658 |
| 7,683,815 B2 * | 3/2010 | Josefsson et al. | ............. | 341/143 |
| 7,724,041 B2 * | 5/2010 | Draxelmayr | .................... | 327/91 |

* cited by examiner

*Primary Examiner* — Kenneth B. Wells

(57) ABSTRACT

A capacitor interface circuit is provided. A capacitor under test (CUT) is divided into a variable portion and an invariable portion, and the capacitance of an offset capacitor is designed to equal to or close to the fixed capacitance of the CUT. The offset capacitor is used to store the charges opposite to the invariable portion of the CUT for neutralizing the effect of the invariable portion of the CUT. Thereupon, the charge converter composed by the fully-differential amplifier and the feedback capacitors only responses for the variable portion of the CUT so as to increase the accuracy of the follow-up data processing.

14 Claims, 10 Drawing Sheets

300

CAPACITOR INTERFACE CIRCUIT

CROSS-REFERENCE TO RELATED APPLICATION

This application claims the priority benefit of Taiwan application serial no. 98111490, filed Apr. 7, 2009. The entirety of the above-mentioned patent application is hereby incorporated by reference herein and made a part of specification.

BACKGROUND OF THE INVENTION

1. Field of the Invention

The present invention relates to an interface circuit, more particularly, to a capacitor interface circuit.

2. Description of the Related Art

FIG. 1 is a circuit diagram of the conventional capacitor interface circuit 100. FIG. 2 is an operation timing chart of the capacitor interface circuit 100 shown in FIG. 1. Referring to FIGS. 1 and 2, the capacitor interface circuit 100 includes a capacitor under test (CUT) Cin, six switches 101 through 106, a fully differential amplifier 107, and two feedback capacitors 108 and 109 with the same capacitance, wherein the fully differential amplifier 107 has a common mode input terminal receiving a common mode voltage Vcm, a positive and a negative input terminals, and a positive and a negative output terminals. The switches 101 through 104 are respectively and sequentially controlled by the control signals CTR1 through CTR4; and the switches 105 and 106 are simultaneously controlled by the reset signal RES.

Conventional, the capacitance of the CUT Cin can be obtained by calculating the formula Cin=Vout/(VREFP−VREFN)*Cint1, wherein VREFP is a positive reference voltage, VREFN is a negative reference voltage, Vout is an output voltage of the capacitor interface circuit 100, and Cint1 is the capacitance of the feedback capacitor 108. In general, the positive reference voltage VREFP, the negative reference voltage VREFN, and the capacitance Cint1 of the feedback capacitor 108 are all given parameters, so the capacitance of the CUT Cin can be calculated by obtaining the output voltage Vout of the capacitor interface circuit 100.

SUMMARY OF THE INVENTION

The present invention is directed to a capacitor interface circuit including a capacitor under test (CUT), an offset capacitor, a fully differential amplifier, a first through an eighth switches, a first and a second reset switches, and a first and a second feedback capacitors. A first terminal of the CUT is coupled to a reference voltage. A first terminal of the first switch is used for receiving a positive reference voltage, a second terminal of the first switch is coupled to a second terminal of the CUT, and a control terminal of the first switch is used for receiving a first control signal. A first terminal of the second switch is coupled to the second terminal of the CUT, and a control terminal of the second switch is used for receiving a second control signal.

A first terminal of the third switch is used for receiving a negative reference voltage, a second terminal of the third switch is coupled to the second terminal of the CUT, and a control terminal of the third switch is used for receiving a third control signal. A first terminal of the fourth switch is coupled to the second terminal of the CUT, and a control terminal of the fourth switch is used for receiving a fourth control signal. A positive input terminal of the fully differential amplifier is coupled to a second terminal of the second switch, and a negative input terminal of the fully differential amplifier is coupled to a second terminal of the fourth switch. A first terminal of the first feedback capacitor is coupled to the second terminal of the second switch, and a second terminal of the first feedback capacitor is coupled to a negative output terminal of the fully differential amplifier.

A first terminal of the first reset switch is coupled to the first terminal of the first feedback capacitor, a second terminal of the first reset switch is coupled to the second terminal of the first feedback capacitor, and a control terminal of the first reset switch is used for receiving a reset signal. A first terminal of the second feedback capacitor is coupled to the second terminal of the fourth switch, and a second terminal of the second feedback capacitor is coupled to a positive output terminal of the fully differential amplifier. A first terminal of the second reset switch is coupled to the first terminal of the second feedback capacitor, a second terminal of the second reset switch is coupled to the second terminal of the second feedback capacitor, and a control terminal of the second reset switch is used for receiving the reset signal.

A first terminal of the offset capacitor is coupled to the reference voltage. A first terminal of the fifth switch is used for receiving the negative reference voltage, a second terminal of the fifth switch is coupled to a second terminal of the offset capacitor, and a control terminal of the fifth switch is used for receiving the first control signal. A first terminal of the sixth switch is coupled to the second terminal of the offset capacitor, a second terminal of the sixth switch is coupled to the positive input terminal of the fully differential amplifier, and a control terminal of the sixth switch is used for receiving the second control signal. A first terminal of the seventh switch is used for receiving the positive reference voltage, a second terminal of the seventh switch is coupled to the second terminal of the offset capacitor, and a control terminal of the seventh switch is used for receiving the third control signal. A first terminal of the eighth switch is coupled to the second terminal of the offset capacitor, a second terminal of the eighth switch is coupled to the negative input terminal of the fully differential amplifier, and a control terminal of the eighth switch is used for receiving the fourth control signal.

According to an exemplary embodiment of the present invention, the capacitance of the CUT is divided into a fixed capacitance and a variable capacitance, and the capacitance of the offset capacitor is substantially equal to the fixed capacitance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
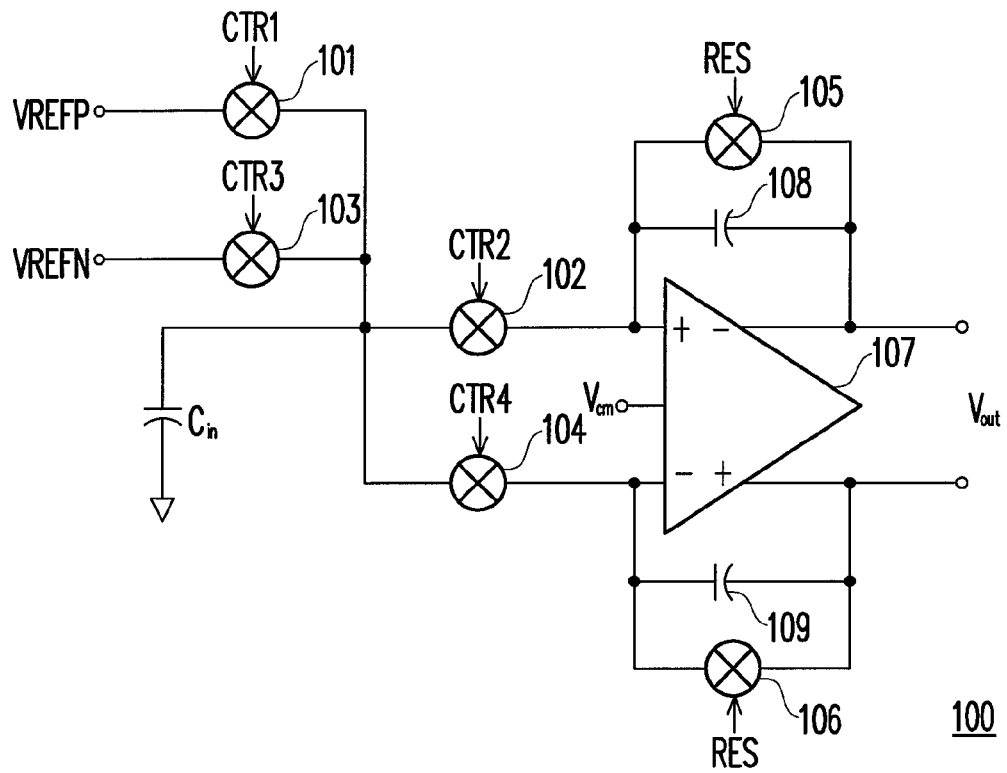
FIG. 1 is a circuit diagram of the conventional capacitor interface circuit.
Figure 2:
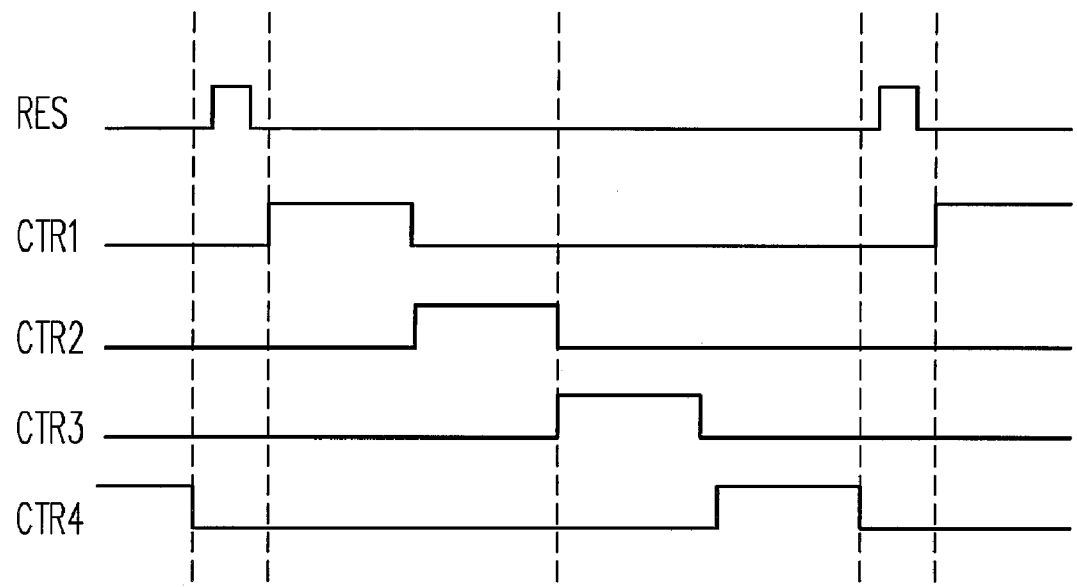
FIG. 2 is an operation timing chart of the capacitor interface circuit 100 shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
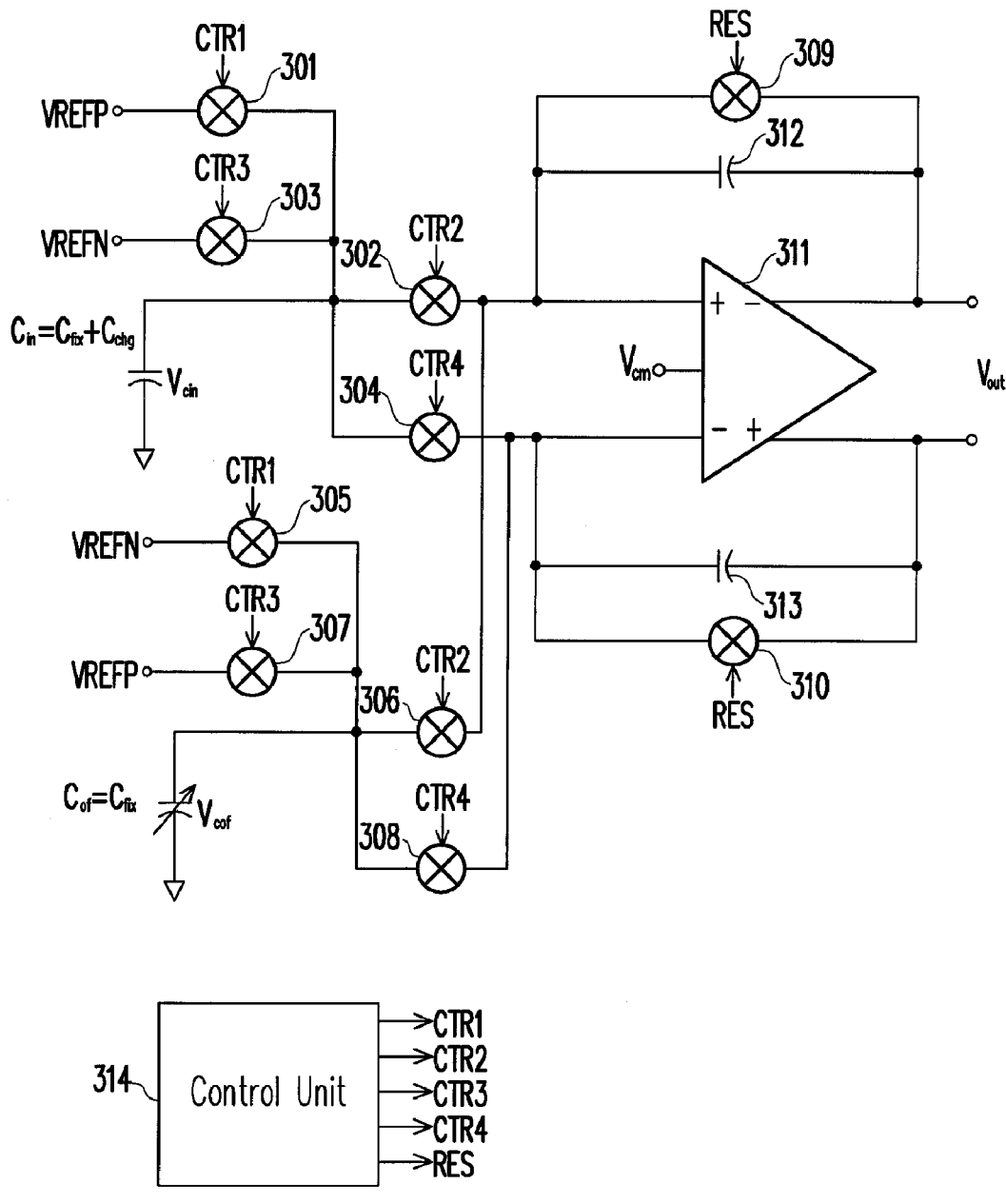
FIG. 3 is a circuit diagram of a capacitor interface circuit according to an exemplary embodiment of the present invention.

FIG. 3 is a circuit diagram of a capacitor interface circuit 300 according to an exemplary embodiment of the present invention. Referring to FIG. 3, the capacitor interface circuit 300 includes a capacitor under test (CUT) Cin, an offset capacitor Cof, eight switches 301 through 308, two reset switches 309 and 310, a fully differential amplifier 311, two feedback capacitors 312 and 313 with the same capacitance, and a control unit 314. A first terminal of the CUT Cin is coupled to a reference voltage such as a ground voltage, but not limited thereto.

A first terminal of the switch 301 is used for receiving a positive reference voltage VREFP, a second terminal of the switch 301 is coupled to a second terminal of the CUT Cin, and a control terminal of the switch 301 is used for receiving a control signal CTR1. A first terminal of the switch 302 is coupled to the second terminal of the CUT Cin, and a control terminal of the switch 302 is used for receiving a control signal CTR2. A first terminal of the switch 303 is used for receiving a negative reference voltage VREFN, a second terminal of the switch 303 is coupled to the second terminal of the CUT Cin, and a control terminal of the switch 303 is used for receiving a control signal CTR3.

A first terminal of the switch 304 is coupled to the second terminal of the CUT Cin, a control terminal of the switch 304 is used for receiving a control signal CTR4. A positive input terminal of the fully differential amplifier 311 is coupled to a second terminal of the switch 302, a negative input terminal of the fully differential amplifier 311 is coupled to a second terminal of the switch 304, and a common mode input terminal of the fully differential amplifier 311 is used for receiving a common mode voltage Vcm. A first terminal of the feedback capacitor 312 is coupled to the second terminal of the switch 302, and a second terminal of the feedback capacitor 312 is coupled to a negative output terminal of the fully differential amplifier 311.

A first terminal of the reset switch 309 is coupled to the first terminal of the feedback capacitor 312, a second terminal of the reset switch 309 is coupled to the second terminal of the feedback capacitor 312, and a control terminal of the reset switch 309 is used for receiving a reset signal RES. A first terminal of the feedback capacitor 313 is coupled to the second terminal of the switch 304, and a second terminal of the feedback capacitor 313 is coupled to a positive output terminal of the fully differential amplifier 311. A first terminal of the reset switch 310 is coupled to the first terminal of the feedback capacitor 313, a second terminal of the reset switch 310 is coupled to the second terminal of the feedback capacitor 313, and a control terminal of the reset switch 310 is used for receiving the reset signal RES.

A first terminal of the offset capacitor Cof is coupled to the reference voltage such as the ground voltage, but not limited thereto. A first terminal of the switch 305 is used for receiving the negative reference voltage VREFN, a second terminal of the switch 305 is coupled to a second terminal of the offset capacitor Cof, and a control terminal of the switch 305 is used for receiving the control signal CTR1. A first terminal of the switch 306 is coupled to the second terminal of the offset capacitor Cof, a second terminal of the switch 306 is coupled to the positive input terminal of the fully differential amplifier 311, and a control terminal of the switch 306 is used for receiving the control signal CTR2.

A first terminal of the switch 307 is used for receiving the positive reference voltage VREFP, a second terminal of the switch 307 is coupled to the second terminal of the offset capacitor Cof, and a control terminal of the switch 307 is used for receiving the control signal CTR3. A first terminal of the switch 308 is coupled to the second terminal of the offset capacitor Cof, a second terminal of the switch 308 is coupled to the negative input terminal of the fully differential amplifier 311, and a control terminal of the switch 308 is used for receiving the control signal CTR4.

Figure 4:
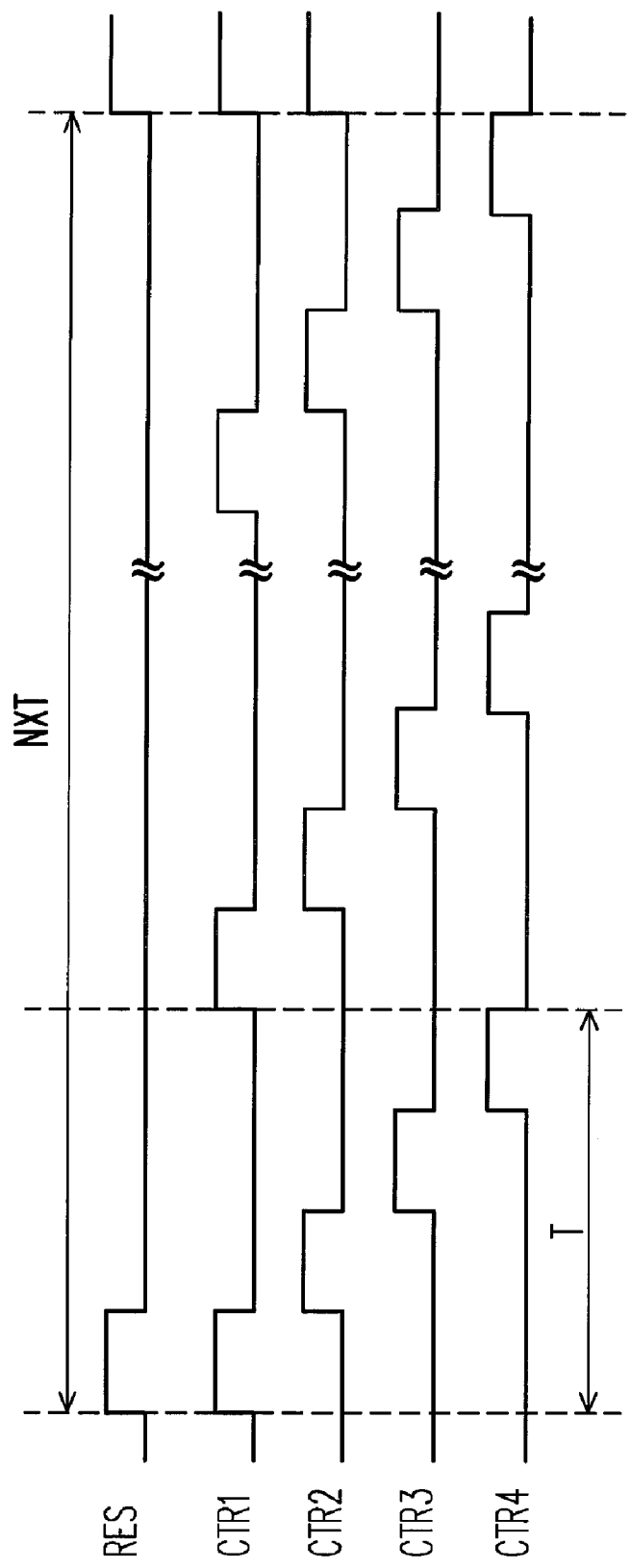
FIG. 4 is an operation timing chart of the capacitor interface circuit shown in FIG. 3.

In the present exemplary embodiment, the control signals CTR1 through CTR4 and the reset signal RES are all generated by the control unit 314. To be specific, FIG. 4 is an operation timing chart of the capacitor interface circuit 300 shown in FIG. 3. Referring to FIGS. 3 and 4, the control unit 314 is respectively coupled to the control terminals of the switches 301 through 308 for generating the control signals CTR1, CTR2, CTR3 and CTR4 in sequence during an operation cycle T of the capacitor interface circuit 300, so as to control the operation of the switches 301 through 308.

In addition, the control unit 314 is further coupled to the control terminals of the reset switches 309 and 310, respectively, for generating the reset signal RES during every N operation cycles T of the capacitor interface circuit 300, so as to control the operation of the reset switches 309 and 310, where N is a positive integer which is larger than or equal to 1, and the value of N is determined by the desired accuracy of the output voltage Vout of the capacitor interface circuit 300.

It should be noted that the control unit 314 may generate the reset signal RES during every 3 (even more or less) operation cycles T of the capacitor interface circuit 300 for making the capacitor interface circuit 300 can be applied to the delta-sigma modulator or the delta-sigma converter, wherein the reset signal RES and the control signal CTR1 are enabled simultaneously.

In the present exemplary embodiment, the capacitance of the CUT Cin may be divided into two portions, one of that is a fixed capacitance Cfix, which is relatively fixed, and another of that is a variable capacitance Cchg, which is relatively and dynamically varied, such that the capacitance of the CUT Cin can be represented to Cin=Cfix+Cchg. The fixed capacitance Cfix may be slowly varied/changed by external surroundings (for example, temperature, humidity, pressure etc.), so the fixed capacitance Cfix can be seen as the fixed value portion at short time; moreover, the capacitance of the offset capacitor Cof is substantially equal to or close to the fixed capacitance Cfix.

In the present exemplary embodiment, a capacitance of the offset capacitor Cof1 may arbitrarily set to a first value as the fully differential amplifier 311 is not saturated, namely, the fully differential amplifier 311 is operated in the linear region. Therefore, the output voltage Vout of the fully differential amplifier 311 can be obtained based on Cchg1, which is Cchg1=Cin−Cof1 =Cfix+Cchg−Cof1, so an inaccuracy Cchg1 can be obtained at this time. The Cchg1 can be seen as a part of the fixed capacitance Cfix when the Cchg1 is slowly and less varied/changed at a long time, such that the Cchg1 can be added to the offset capacitor Cof Accordingly, the offset capacitor Cof−Cof1+Cchg1=Cof1+(Cin−Cof1)=Cin, it can be seen as the Cchg=0 and Cof=Cin=Cfix. Thereupon, the capacitance of the offset capacitor Cof is substantially equal to or close to the fixed capacitance Cfix.

After the capacitance of the offset capacitor Cof is determined, namely, Cof=Cfix. The operation process of the capacitor interface circuit 300 will be described in below.

Please refer to FIGS. 3 and 4 again, when the control signal CTR1 and the reset signal RES generated from the control unit 314 are enabled simultaneously, the reset switches 309 and 310 would be turned on simultaneously so as to eliminate the charges on the feedback capacitors 312 and 313, and thus the output voltage Vout of the capacitor interface circuit 300 may equal to 0, namely, Vout=0.

However, in other exemplary embodiments of the present invention, when the reset switches 309 and 310 are turned on simultaneously, the output voltage Vout of the capacitor interface circuit 300 may be a given initial voltage Vinit, which is a non zero value, namely, Vout=Vinit. Accordingly, when an end processing circuit (not shown) receiving the output voltage Vout of the capacitor interface circuit 300 performs the end process, after the end processing circuit subtracts the initial voltage Vinit from the received output voltage Vout, namely, Vout-Vinit, it also can be seen as the output voltage Vout of the capacitor interface circuit 300 is equal to 0, namely, Vout=0.

In addition, when the output voltage Vout of the capacitor interface circuit 300 is equal to 0, namely, Vout=0, since the switches 301 and 305 are also turned on simultaneously, the terminal voltage Vcin of the CUT Cin is equal to the positive reference voltage VREFP, namely, Vcin=VREFP, and the terminal voltage Vcof of the offset capacitor Cof is equal to the negative reference voltage VREFN, namely, Vcof=VREFN.

When the control signal CTR2 generated from the control unit 314 is enabled, since the switches 302 and 306 are turned on simultaneously, the terminal voltage Vcin of the CUT Cin is equal to the common mode voltage Vcm, and the terminal voltage Vcof of the offset capacitor Cof is also equal to the common mode voltage Vcm. Therefore, the output voltage Vout=Cin/Cint1*(VREFP−Vcm)+Cof/Cint1*(VREFN−Vcm), wherein Cin is the capacitance of the CUT Cin, Cint1 is the capacitance of the feedback capacitor 312, and Cof is the capacitance of the offset capacitor Cof.

When the control signal CTR3 generated from the control unit 314 is enabled, since the switches 303 and 307 are turned on simultaneously, the terminal voltage Vcin of the CUT Cin is equal to the negative reference voltage VREFN, and the terminal voltage Vcof of the offset capacitor Cof is equal to the positive reference voltage VREFP. At this time, the output voltage Vout=Cin/Cint1*(VREFP−Vcm)+Cof/Cint1*(VREFN−Vcm).

When the control signal CTR4 generated from the control unit 314 is enabled, since the switches 304 and 308 are turned on simultaneously, the terminal voltage Vcin of the CUT Cin is equal to the common mode voltage Vcm, and the terminal voltage Vcof of the offset capacitor Cof is also equal to the common mode voltage Vcm. Therefore, the output voltage Vout=(Cin−Cof)/Cint1*(VREFP−VREFN).

Herein, since the control unit 314 would generate the reset signal RES during every N operation cycles T of the capacitor interface circuit 300. Therefore, the output voltage Vout=N*(Cin−Cof)/Cint1*(VREFP−VREFN). In addition, according to the above-mentioned description, the CUT Cin=Cfix+Cchg, so it can be further inferred that the Cchg−[Vout/(VREFP−VREFN)]*(Cint1/N). In general, the positive reference VREFP, the negative reference voltage VREFN, the value of N, and the capacitance Cint1 of the feedback capacitor 312 are all given parameters, so the portion of the variable capacitance Cchg, which is relatively and dynamically varied, in the CUT Cin can be calculated by obtaining the output voltage Vout of the capacitor interface circuit 300.

From the above, in the present exemplary embodiment, the CUT Cin is divided into the variable portion (i.e. the variable capacitance Cchg) and the invariable portion (i.e. the fixed capacitance Cfix); moreover, the capacitance of the offset capacitor Cof is designed to equal to or close to the fixed capacitance Cfix of the CUT Cin; furthermore, the offset capacitor Cof is used to store the charges opposite to the invariable portion of the CUT Cin for neutralizing the effect of the invariable portion of the CUT Cin. Thereupon, the charge converter composed by the fully-differential amplifier 311 and the feedback capacitors 312 and 313 only responses for the variable portion of the CUT Cin so as to increase the accuracy of the follow-up data processing.

Figure 5:
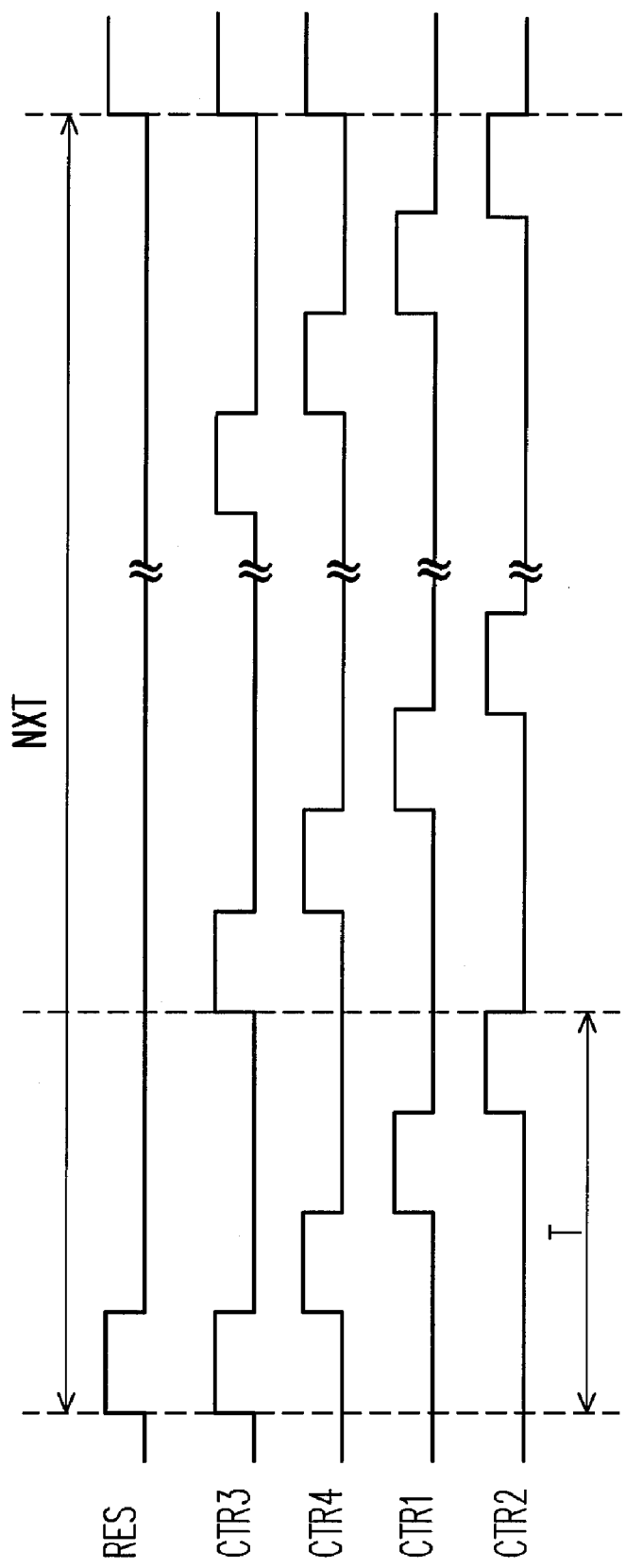
FIG. 5 is another operation timing chart of the capacitor interface circuit shown in FIG. 3.

FIG. 5 is another operation timing chart of the capacitor interface circuit 300 shown in FIG. 3. Referring to FIGS. 3 through 5, it can be clearly seen from FIG. 5 that the control unit 314 is used for generating the control signals CTR3, CTR4, CTR1 and CTR2 in sequence during the operation cycle T of the capacitor interface circuit 300, and generating the reset signal RES during every N operation cycles T of the capacitor interface circuit 300, where N is a positive integer which is larger than or equal to 1, and the value of N is determined by the desired accuracy of the output voltage Vout of the capacitor interface circuit 300; moreover, the reset signal RES and the control signal CTR3 are enabled simultaneously.

The operation process of the capacitor interface circuit 300 using the operation timing chart shown in FIG. 5 is substantially similar to the operation process of the capacitor interface circuit 300 using the operation timing chart shown in FIG. 4. In addition, one person having ordinary skilled in the art can be simply inferred the real operation process of the capacitor interface circuit 300 using the operation timing chart shown in FIG. 5 through the explaining and teaching of the above exemplary embodiment, so the detail description would be omitted herein, and the variation exemplary embodiments would fall within the scope of the present invention.

Figure 6:
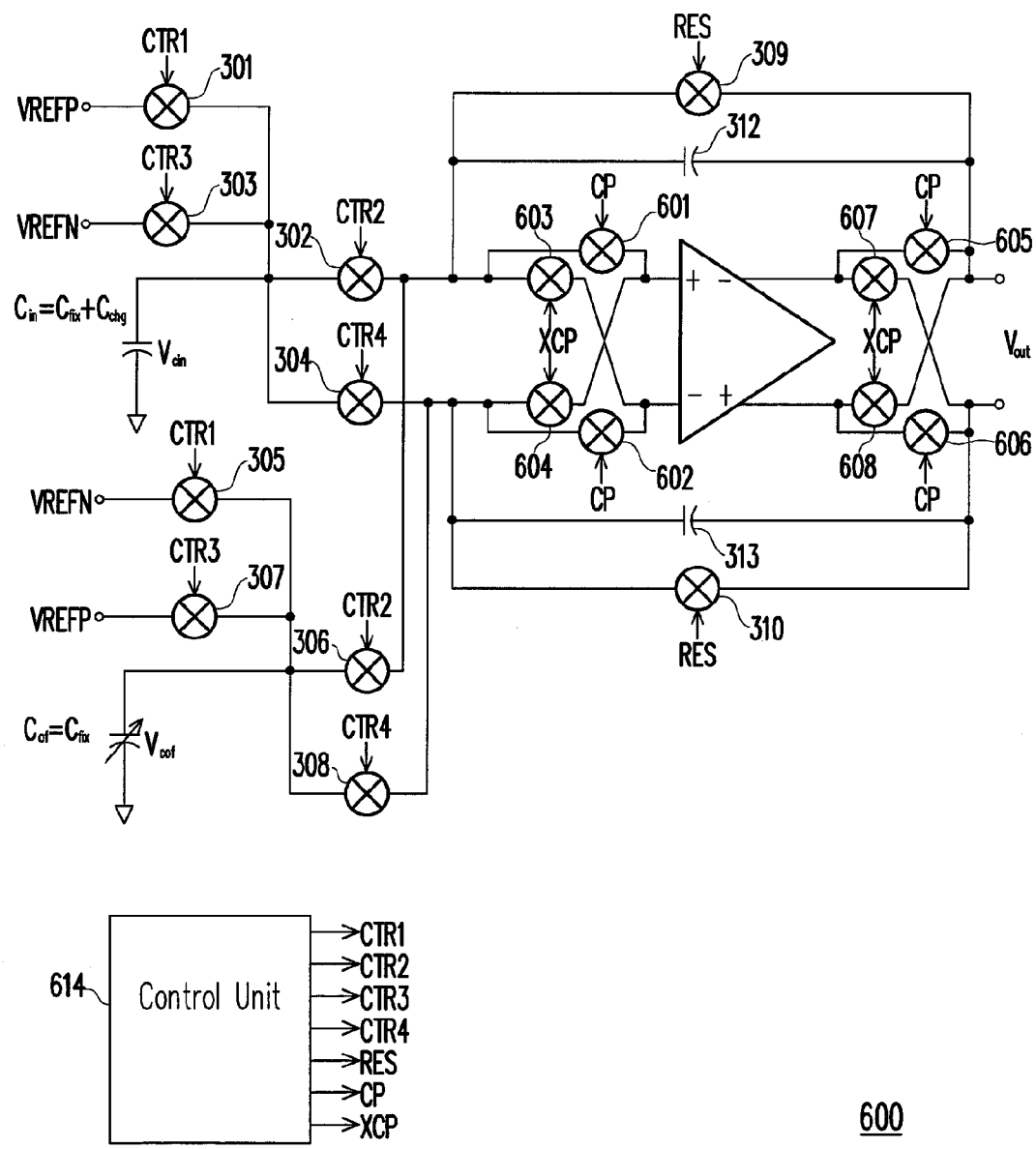
FIG. 6 is a circuit diagram of a capacitor interface circuit according to another exemplary embodiment of the present invention.

FIG. 6 is a circuit diagram of a capacitor interface circuit 600 according to another exemplary embodiment of the present invention. Referring to FIGS. 3 and 6, the difference between the capacitor interface circuits 300 and 600 is that eight switches 601 through 608 are added in FIG. 6 compared with FIG. 3, wherein the switches 601 through 608 constitute a chopper stabilization circuit. A first terminal of the switch 601 is coupled to the second terminal of the switch 302, a second terminal of the switch 601 is coupled to the positive input terminal of the fully differential amplifier 311, and a control terminal of the switch 601 is used for receiving a control signal CP.

A first terminal of the switch 602 is coupled to the second terminal of the switch 304, a second terminal of the switch 602 is coupled to the negative input terminal of the fully differential amplifier 311, and a control terminal of the switch 602 is used for receiving the control signal CP. A first terminal of the switch 603 is coupled to the second terminal of the switch 302, a second terminal of the switch 603 is coupled to the second terminal of the switch 602, and a control terminal of the switch 603 is used for receiving a control signal XCP. A first terminal of the switch 604 is coupled to the second terminal of the switch 304, a second terminal of the switch 604 is coupled to the second terminal of the switch 601, and a control terminal of the switch 604 is used for receiving a control signal XCP.

A first terminal of the switch 605 is coupled to the negative output terminal of the fully differential amplifier 311, a second terminal of the switch 605 is coupled to the second terminal of the feedback capacitor 312, and a control terminal of the switch 605 is used for receiving the control signal CP. A first terminal of the switch 606 is coupled to the positive output terminal of the fully differential amplifier 311, a second terminal of the switch 606 is coupled to the second terminal of the feedback capacitor 313, and a control terminal of the switch 606 is used for receiving the control signal CP. A first terminal of the switch 607 is coupled to the first terminal of the switch 605, a second terminal of the switch 607 is coupled to the second terminal of the switch 606, and a control terminal of the switch 607 is used for receiving the control signal XCP. A first terminal of the switch 608 is coupled to the first terminal of the switch 606, a second terminal of the switch 608 is coupled to the second terminal of the switch 605, and a control terminal of the switch 608 is used for receiving the control signal XCP.

Figure 7:
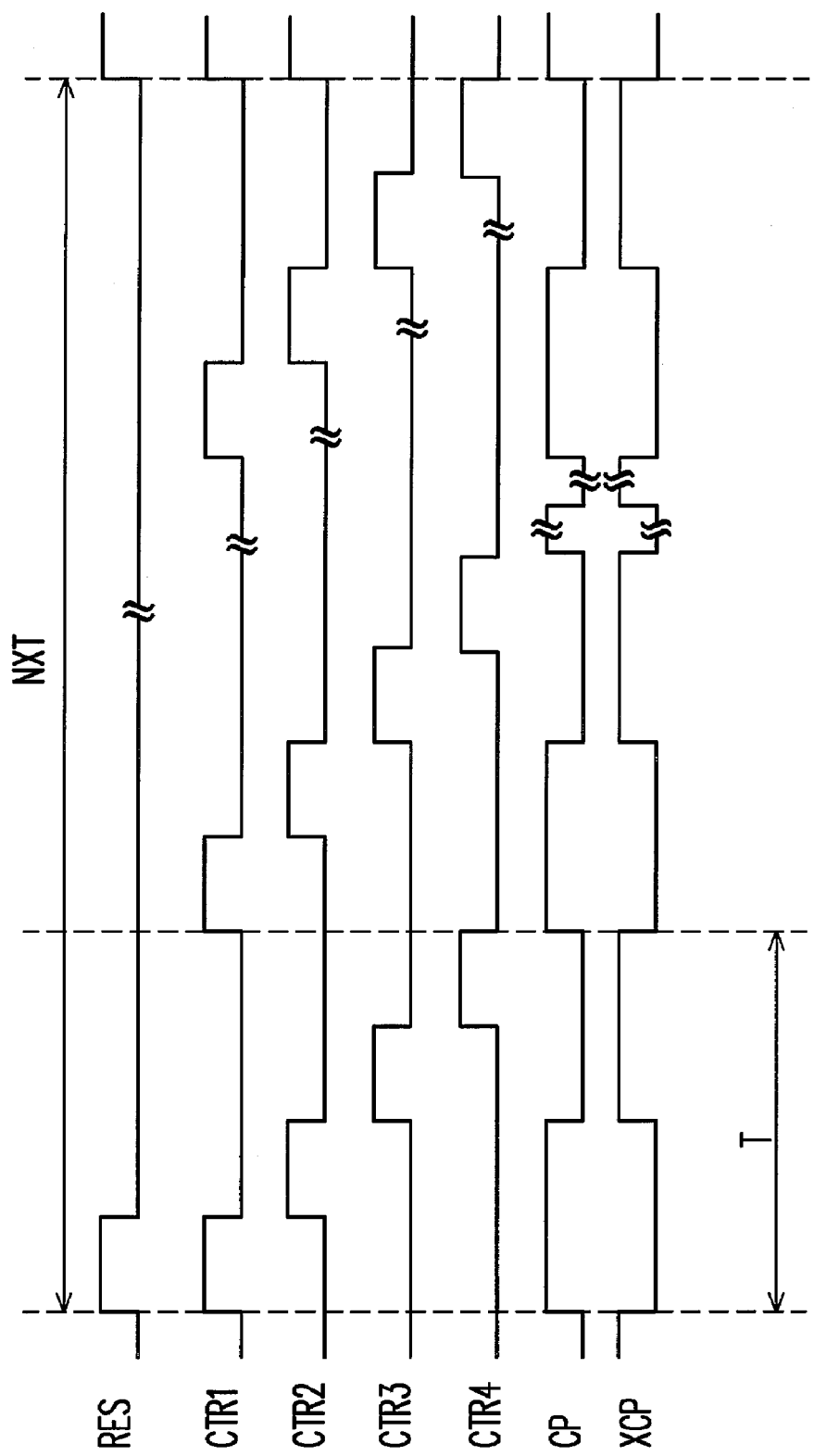
FIG. 7 is an operation timing chart of the capacitor interface circuit shown in FIG. 6.

In the present exemplary embodiment, the control signals CTR1 through CTR4, the reset signal RES and the control signals CP and XCP are all generated by the control unit 614. To be specific, FIG. 7 is an operation timing chart of the capacitor interface circuit 600 shown in FIG. 6. Referring to FIGS. 6 and 7, the control unit 614 is respectively coupled to the control terminals of the switches 301 through 308 for generating the control signals CTR1, CTR2, CTR3 and CTR4 in sequence during an operation cycle T of the capacitor interface circuit 600, so as to control the operation of the switches 301 through 308.

In addition, the control unit 614 is further coupled to the control terminals of the reset switches 309 and 310, respectively, for generating the reset signal RES during every N operation cycles T of the capacitor interface circuit 600, so as to control the operation of the reset switches 309 and 310, where N is a positive integer which is larger than or equal to 1, and the value of N is determined by the desired accuracy of the output voltage Vout of the capacitor interface circuit 600.

It should be noted that the control unit 614 may generate the reset signal RES during every 3 (even more or less) operation cycles T of the capacitor interface circuit 600 for making the capacitor interface circuit 600 be applied to the delta-sigma modulator or the delta-sigma converter, wherein the reset signal RES and the control signal CTR1 are enabled simultaneously.

Furthermore, the control unit 614 is further coupled to the control terminals of the switches 601 through 608 for generating the control signals CP and XCP in sequence during the operation cycle T of the capacitor interface circuit 600, wherein the phase difference between the control signals CP and XCP is 180 degrees. In the present exemplary embodiment, the control signal CP is enabled during the control signals CTR1 and CTR2 are enabled in sequence, and the control signal CP is disabled during the control signals CTR3 and CTR4 are enabled in sequence. Moreover, the control signal XCP is disabled during the control signals CTR1 and CTR2 are enabled in sequence, and the control signal XCP is enabled during the control signals CTR3 and CTR4 are enabled in sequence.

The chopper stabilization circuit constituted by the switches 601 through 608 not only may remove/eliminate the offset error of the fully differential amplifier 311, but also may remove/eliminate the low frequency flicker noise of the fully differential amplifier 311, such that the capacitor interface circuit 600 is relatively stable and accuracy than the capacitor interface circuit 300.

Figure 8:
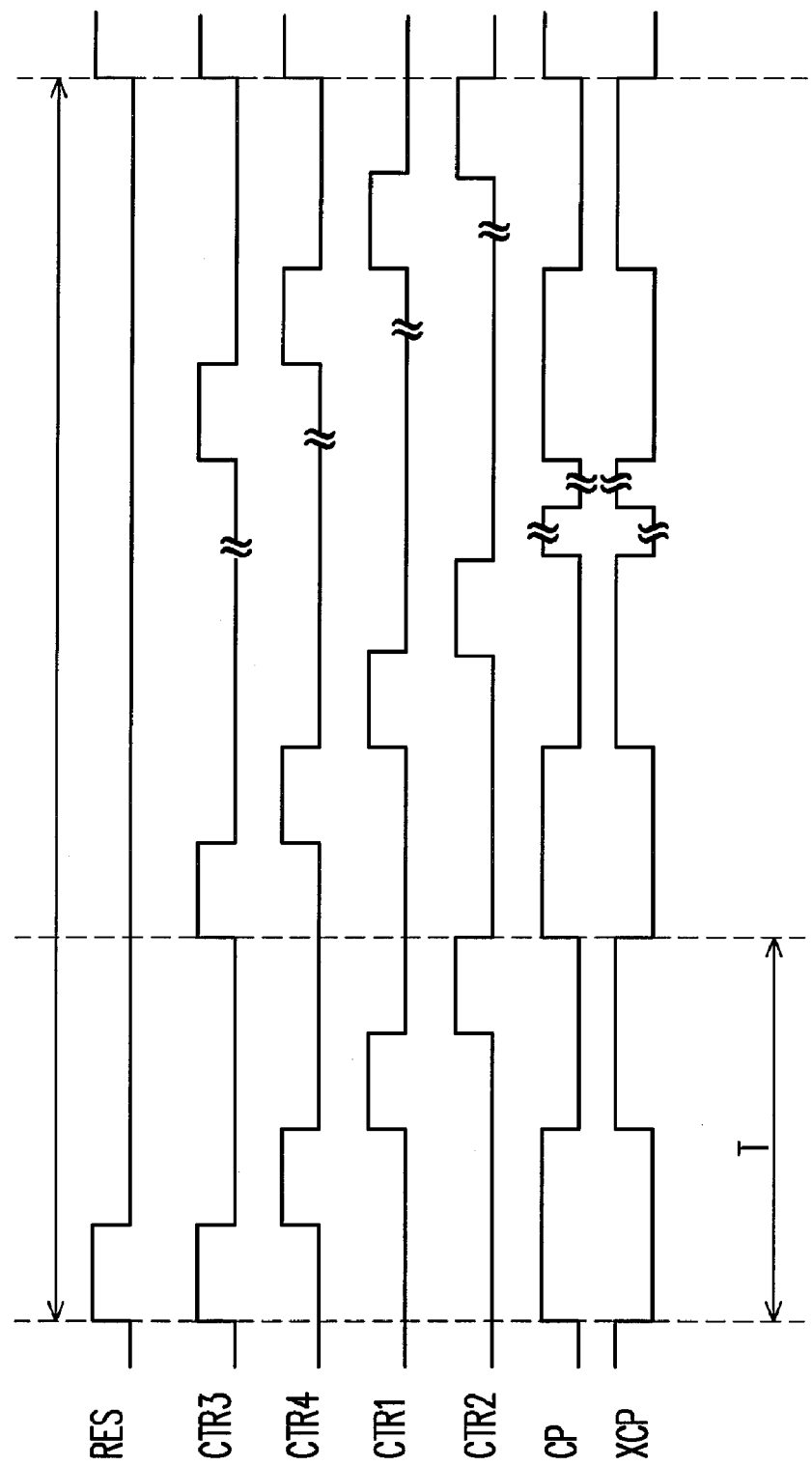
FIG. 8 is another operation timing chart of the capacitor interface circuit shown in FIG. 6.

FIG. 8 is another operation timing chart of the capacitor interface circuit 600 shown in FIG. 6. Referring to FIGS. 6 through 8, it can be clearly seen from FIG. 8 that the control unit 614 is used for generating the control signals CTR3, CTR4, CTR1 and CTR2 in sequence during the operation cycle T of the capacitor interface circuit 600, and generating the reset signal RES during every N operation cycles T of the capacitor interface circuit 600, where N is a positive integer which is larger than or equal to 1, and the value of N is determined by the desired accuracy of the output voltage Vout of the capacitor interface circuit 600; moreover, the reset signal RES and the control signal CTR3 are enabled simultaneously.

The operation process of the capacitor interface circuit 600 using the operation timing chart shown in FIG. 8 is substantially similar to the operation process of the capacitor interface circuit 600 using the operation timing chart shown in FIG. 7. In addition, one person having ordinary skilled in the art can be simply inferred the real operation process of the capacitor interface circuit 600 using the operation timing chart shown in FIG. 8 through the explaining and teaching of the above exemplary embodiment, so the detail description would be omitted herein, and the variation exemplary embodiments would fall within the scope of the present invention.

Figure 9:
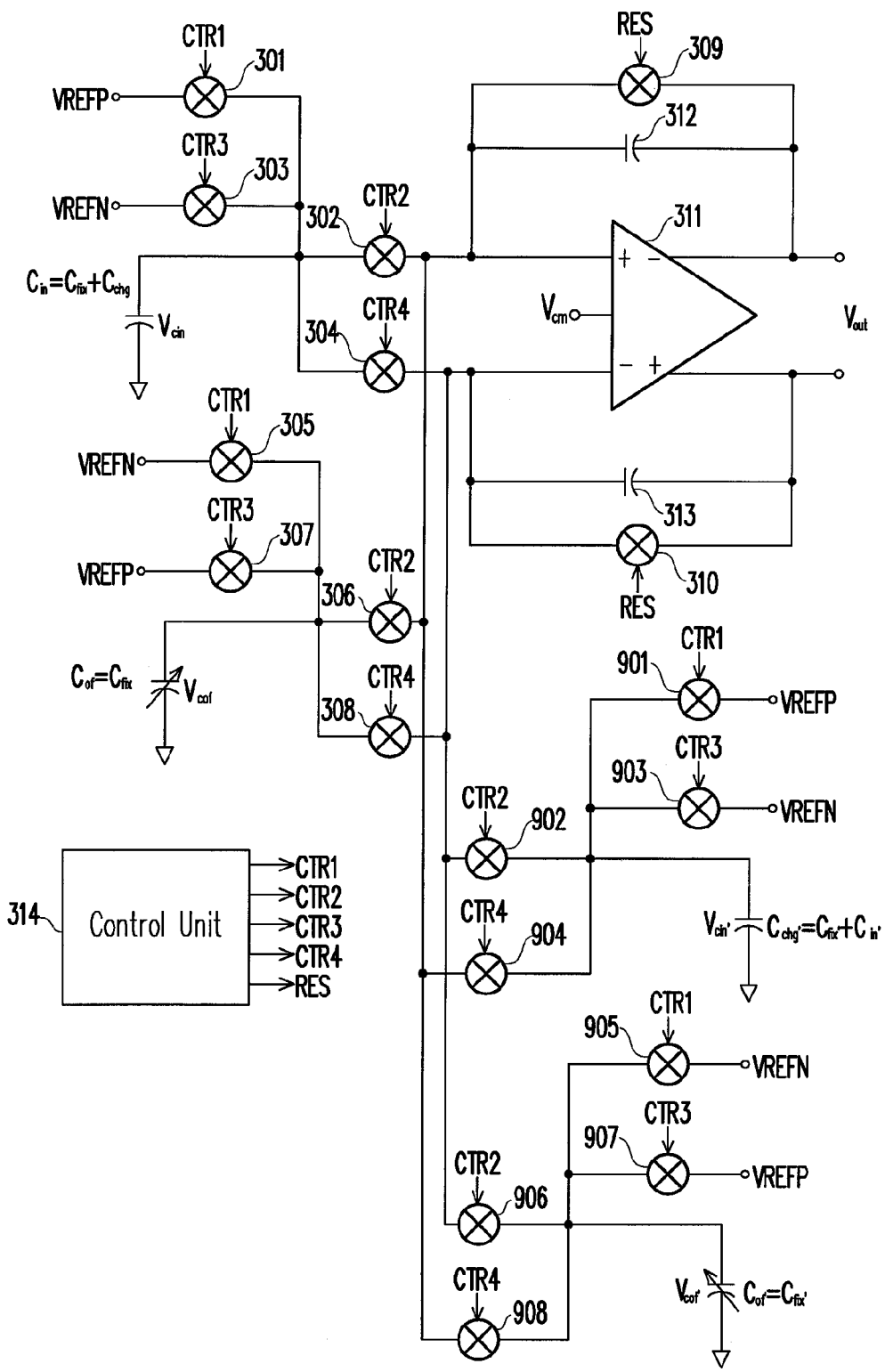
FIGS. 9 and 10 are respectively a circuit diagram of a capacitor interface circuit according to another exemplary embodiment of the present invention.

FIG. 9 is respectively a circuit diagram of a capacitor interface circuit according to another exemplary embodiment of the present invention. Referring to FIGS. 3 and 9, the difference between the capacitor interface circuits 300 and 900 is that eight switches 901 through 908, a CUT Cin' and an offset capacitor Cof' are added in FIG. 9 compared with FIG. 3. A first terminal of the CUT Cin' is coupled to the reference voltage such as the ground voltage, but not limited thereto.

A first terminal of the switch 901 is used for receiving the positive reference voltage VREFP, a second terminal of the switch 901 is coupled to a second terminal of the CUT Cin', and a control terminal of the switch 901 is used for receiving the control signal CTR1. A first terminal of the switch 902 is coupled to the second terminal of the CUT Cin', a second terminal of the switch 902 is coupled to the negative input terminal of the fully differential amplifier 311, and a control terminal of the switch 902 is used for receiving the control signal CTR2. A first terminal of the switch 903 is used for receiving the negative reference voltage VREFN, a second terminal of the switch 903 is coupled to the second terminal of the CUT Cin', and a control terminal of the switch 903 is used for receiving the control signal CTR3.

A first terminal of the switch 904 is coupled to the second terminal of the CUT Cin', a second terminal of the switch 904 is coupled to the positive input terminal of the fully differential amplifier 311, and a control terminal of the switch 904 is used for receiving the control signal CTR4. A first terminal of the offset capacitor Cof' is coupled to the reference voltage such as the ground voltage, but not limited thereto. A first terminal of the switch 905 is used for receiving the negative reference voltage VREFN, a second terminal of the switch 905 is coupled to a second terminal of the offset capacitor Cof', and a control terminal of the switch 905 is used for receiving the control signal CTR1.

A first terminal of the switch 906 is coupled to the second terminal of the offset capacitor Cof', a second terminal of the switch 906 is coupled to the negative input terminal of the fully differential amplifier 311, and a control terminal of the switch 906 is used for receiving the control signal CTR2. A first terminal of the switch 907 is used for receiving the positive reference voltage VREFP, a second terminal of the switch 907 is coupled to the second terminal of the offset capacitor Cof', and a control terminal of the switch 907 is used for receiving the control signal CTR3. A first terminal of the switch 908 is coupled to the second terminal of the offset capacitor Cof', a second terminal of the switch 908 is coupled to the positive input terminal of the fully differential amplifier 311, and a control terminal of the switch 908 is used for receiving the control signal CTR4.

In the present exemplary embodiment, the operation timing chart of the capacitor interface circuit 900 is similar to the capacitor interface circuit 300. Herein, referring to FIGS. 3, 4 and 9, the control unit 314 is respectively coupled to the control terminals of the switches 301 through 308 and 901 through 908 for generating the control signals CTR1, CTR2, CTR3 and CTR4 in sequence during an operation cycle T of the capacitor interface circuit 900, so as to control the operation of the switches 301 through 308 and 901 through 908.

In addition, the capacitance of the CUT Cin' may be divided into two portions, one of that is a fixed capacitance Cfix', which is relatively fixed, and another of that is a variable capacitance Cchg', which is relatively and dynamically varied, such that the capacitance of the CUT Cin' can be represented to Cin'=Cfix'+Cchg'. The fixed capacitance Cfix' may be slowly varied/changed by external surroundings (for example, temperature, humidity, pressure etc.), so the fixed capacitance Cfix' can be seen as the fixed value portion at short time; moreover, the capacitance of the offset capacitor Cof' is substantially equal to or close to the fixed capacitance Cfix'.

In the present exemplary embodiment, when the control signal CTR1 and the reset signal RES generated from the control unit 314 are enabled simultaneously, the reset switches 309 and 310 would be turned on simultaneously so as to eliminate the charges on the feedback capacitors 312 and 313, and thus the output voltage Vout of the capacitor interface circuit 900 may equal to 0, namely, Vout=0.

However, in other exemplary embodiments of the present invention, when the reset switches 309 and 310 are turned on simultaneously, the output voltage Vout of the capacitor interface circuit 900 may be a given initial voltage Vinit, which is a non zero value, namely, Vout=Vinit. Accordingly, when an end processing circuit (not shown) receiving the output voltage Vout of the capacitor interface circuit 900 performs the end process, after the end processing circuit subtracts the initial voltage Vinit from the received output voltage Vout, namely, Vout-Vinit, it also can be seen as the output voltage Vout of the capacitor interface circuit 900 is equal to 0, namely, Vout=0.

In addition, when the output voltage Vout of the capacitor interface circuit 900 is equal to 0, namely, Vout=0, since the switches 301, 305, 901 and 905 are also turned on simultaneously, the terminal voltages Vcin and Vcin' of the CUTs Cin and Cin' are equal to the positive reference voltage VREFP, namely, Vcin=Vcin'=VREFP, and the terminal voltages Vcof and Vcof' of the offset capacitors Cof and Cof' are equal to the negative reference voltage VREFN, namely, Vcof=Vcof'=VREFN.

When the control signal CTR2 generated from the control unit 314 is enabled, since the switches 302, 306, 902 and 906 are turned on simultaneously, the terminal voltages Vcin and Vcin' of the CUTs Cin and Cin' are equal to the common mode voltage Vcm, and the terminal voltages Vcof and Vcof' of the offset capacitors Cof and Cof' are also equal to the common mode voltage Vcm. Therefore, the output voltage Vout=(Cin−Cin')/Cint1*(VREFP−Vcm)+(Cof−Cof')/Cint1*(VREFN−Vcm), wherein Cin and Cin' are respectively the capacitances of the CUTs Cin and Cin', Cint1 is the capacitance of the feedback capacitor 312, and Cof and Cof' are respectively the capacitances of the offset capacitors Cof and Cof'.

When the control signal CTR3 generated from the control unit 314 is enabled, since the switches 303, 307, 903 and 907 are turned on simultaneously, the terminal voltages Vein and Vein' of the CUTs Cin and Cin' are equal to the negative reference voltage VREFN, and the terminal voltages Vcof and Vcof' of the offset capacitors Cof and Cof' are equal to the positive reference voltage VREFP. At this time, the output voltage Vout=(Cin−Cin')/Cint1*(VREFP−Vcm)+(Cof−Cof')/Cint1*(VREFN−Vcm).

When the control signal CTR4 generated from the control unit 314 is enabled, since the switches 304, 308, 904 and 908 are turned on simultaneously, the terminal voltages Vcin and Vcin' of the CUTs Cin and Cin' are equal to the common mode voltage Vcm, and the terminal voltages Vcof and Vcof' of the offset capacitors Cof and Cof' are also equal to the common mode voltage Vcm. Therefore, the output voltage Vout=((Cin−Cin')−(Cof−Cof'))/Cint1*(VREFP−VREFN).

From the above, in the present exemplary embodiment, the CUTs Cin and Cin' are respectively divided into the variable portion (i.e. the variable capacitance Cchg and Cchg') and the invariable portion (i.e. the fixed capacitance Cfix and Cfix'); moreover, the capacitances of the offset capacitors Cof and Cof' are respectively designed to equal to or close to the fixed capacitances Cfix and Cfix' of the CUTs Cin and Cin'; furthermore, the offset capacitors Cof and Cof' are respectively used to store the charges opposite to the invariable portion of the CUTs Cin and Cin' for neutralizing the effect of the invariable portion of the CUTs Cin and Cin'. Thereupon, the charge converter composed by the fully-differential amplifier 311 and the feedback capacitors 312 and 313 only responses for the variable portion of the CUTs Cin and Cin' so as to increase the accuracy of the follow-up data processing.

Similarly, the operation timing chart shown in FIG. 5 also can be used in the capacitor interface circuit 900, and the operation process of the capacitor interface circuit 900 using the operation timing chart shown in FIG. 5 is substantially similar to the operation process of the capacitor interface circuit 900 using the operation timing chart shown in FIG. 4. In addition, one person having ordinary skilled in the art can be simply inferred the real operation process of the capacitor interface circuit 900 using the operation timing chart shown in FIG. 5 through the explaining and teaching of the above exemplary embodiment, so the detail description would be omitted herein, and the variation exemplary embodiments would fall within the scope of the present invention.

Figure 10:
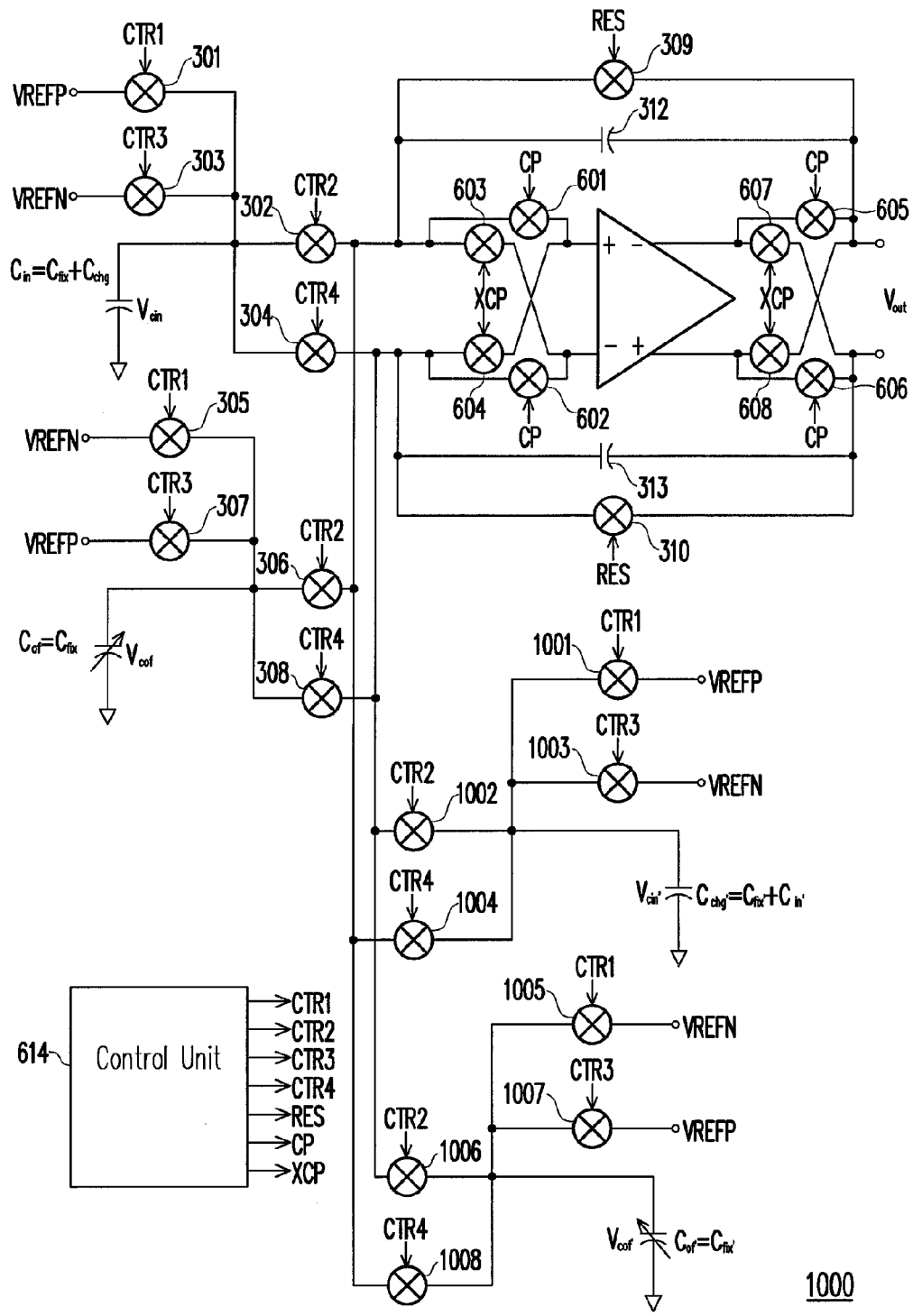

FIG. 10 is a circuit diagram of a capacitor interface circuit 1000 according to another exemplary embodiment of the present invention. Referring to FIGS. 6 and 10, the difference between the capacitor interface circuits 600 and 1000 is that eight switches 1001 through 1008, a CUT Cin' and an offset capacitor Cof' are added in FIG. 10 compared with FIG. 6. A first terminal of the CUT Cin' is coupled to the reference voltage such as the ground voltage, but not limited thereto.

A first terminal of the switch 1001 is used for receiving the positive reference voltage VREFP, a second terminal of the switch 1001 is coupled to a second terminal of the CUT Cin', and a control terminal of the switch 1001 is used for receiving the control signal CTR1. A first terminal of the switch 1002 is coupled to the second terminal of the CUT Cin', a second terminal of the switch 1002 is coupled to the first terminal of the switch 604, and a control terminal of the switch 1002 is used for receiving the control signal CTR2. A first terminal of the switch 1003 is used for receiving the negative reference voltage VREFN, a second terminal of the switch 1003 is coupled to the second terminal of the CUT Cin', and a control terminal of the switch 1003 is used for receiving the control signal CTR3.

A first terminal of the switch 1004 is coupled to the second terminal of the CUT Cin', a second terminal of the switch 1004 is coupled to the first terminal of the switch 603, and a control terminal of the switch 1004 is used for receiving the control signal CTR4. A first terminal of the offset capacitor Cof' is coupled to the reference voltage such as the ground voltage, but not limited thereto. A first terminal of the switch 1005 is used for receiving the negative reference voltage VREFN, a second terminal of the switch 1005 is coupled to a second terminal of the offset capacitor Cof', and a control terminal of the switch 1005 is used for receiving the control signal CTR1.

A first terminal of the switch 1006 is coupled to the second terminal of the offset capacitor Cof', a second terminal of the switch 1006 is coupled to the first terminal of the switch 604, and a control terminal of the switch 1006 is used for receiving the control signal CTR2. A first terminal of the switch 1007 is used for receiving the positive reference voltage VREFP, a second terminal of the switch 1007 is coupled to the second terminal of the offset capacitor Cof', and a control terminal of the switch 1007 is used for receiving the control signal CTR3. A first terminal of the switch 1008 is coupled to the second terminal of the offset capacitor Cof', a second terminal of the switch 1008 is coupled to the first terminal of the switch 603, and a control terminal of the switch 1008 is used for receiving the control signal CTR4.

In the present exemplary embodiment, the operation timing chart of the capacitor interface circuit 1000 is similar to the capacitor interface circuit 600. Herein, referring to FIGS. 6, 7 and 10, the control unit 614 is respectively coupled to the control terminals of the switches 301 through 308 and 1001 through 1008 for generating the control signals CTR1, CTR2, CTR3 and CTR4 in sequence during an operation cycle T of the capacitor interface circuit 1000, so as to control the operation of the switches 301 through 308 and 1001 through 1008.

In addition, the capacitance of the CUT Cin' may be divided into two portions, one of that is a fixed capacitance Cfix', which is relatively fixed, and another of that is a variable capacitance Cchg', which is relatively and dynamically varied, such that the capacitance of the CUT Cin' can be represented to Cin'=Cfix'+Cchg'. The fixed capacitance Cfix' may be slowly varied/changed by external surroundings (for example, temperature, humidity, pressure etc.), so the fixed capacitance Cfix' can be seen as the fixed value portion at short time; moreover, the capacitance of the offset capacitor Cof' is substantially equal to or close to the fixed capacitance Cfix'.

The real operation process relating to the capacitor interface circuit 1000 can be inferred by referring FIGS. 6, 7 and 9, so the detail description would be omitted herein.

Similarly, the operation timing chart shown in FIG. 8 also can be used in to the capacitor interface circuit 1000, and the operation process of the capacitor interface circuit 1000 using the operation timing chart shown in FIG. 8 is substantially similar to the operation process of the capacitor interface circuit 1000 using the operation timing chart shown in FIG. 7. In addition, one person having ordinary skilled in the art can be simply inferred the real operation process of the capacitor interface circuit 1000 using the operation timing chart shown in FIG. 8 through the explaining and teaching of the above exemplary embodiment, so the detail description would be omitted herein, and the variation exemplary embodiments would fall within the scope of the present invention.

The capacitor interface circuits 300, 600, 900 and 1000 of the above exemplary embodiments can be applied to the delta-sigma modulator or the delta-sigma converter, and the output of the delta-sigma modulator or the delta-sigma converter is direct proportion to the variable portion of the CUT Cin and/or CUT Cin'. However, since the hardware structure of the delta-sigma modulator or the delta-sigma converter is well known in the art, so the detail description would be omitted herein.

In summary, a capacitor under test (CUT), for the present invention, is divided into a variable portion and an invariable portion, and the capacitance of an offset capacitor is designed to equal to or close to the fixed capacitance of the CUT. The offset capacitor is used to store the charges opposite to the invariable portion of the CUT for neutralizing the effect of the invariable portion of the CUT. Thereupon, the charge converter composed by the fully-differential amplifier and the feedback capacitors only responses for the variable portion of the CUT so as to increase the accuracy of the follow-up data processing.

It will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A capacitor interface circuit, comprising:
   a first capacitor under test (CUT), having a first terminal coupled to a reference voltage;
   a first switch, having a first terminal receiving a positive reference voltage, a second terminal coupled to a second terminal of the first CUT, and a control terminal receiving a first control signal;
   a second switch, having a first terminal coupled to the second terminal of the first CUT, and a control terminal receiving a second control signal;
   a third switch, having a first terminal receiving a negative reference voltage, a second terminal coupled to the second terminal of the first CUT, and a control terminal receiving a third control signal;
   a fourth switch, having a first terminal coupled to the second terminal of the first CUT, and a control terminal receiving a fourth control signal;
   a fully differential amplifier, having a positive input terminal coupled to a second terminal of the second switch, a negative input terminal coupled to a second terminal of the fourth switch, and a output voltage of the fully differential amplifier between a positive output terminal and a negative output terminal;
   a first feedback capacitor, having a first terminal coupled to the second terminal of the second switch, and a second terminal coupled to a negative output terminal of the fully differential amplifier;
   a first reset switch, having a first terminal coupled to the first terminal of the first feedback capacitor, a second terminal coupled to the second terminal of the first feedback capacitor, and a control terminal receiving a reset signal;
   a second feedback capacitor, having a first terminal coupled to the second terminal of the fourth switch, and a second terminal coupled to a positive output terminal of the fully differential amplifier;

a second reset switch, having a first terminal coupled to the first terminal of the second feedback capacitor, a second terminal coupled to the second terminal of the second feedback capacitor, and a control terminal receiving the reset signal;

a first offset capacitor, having a first terminal coupled to the reference voltage;

a fifth switch, having a first terminal receiving the negative reference voltage, a second terminal coupled to a second terminal of the first offset capacitor, and a control terminal receiving the first control signal;

a sixth switch, having a first terminal coupled to the second terminal of the first offset capacitor, a second terminal coupled to the positive input terminal of the fully differential amplifier, and a control terminal receiving the second control signal;

a seventh switch, having a first terminal receiving the positive reference voltage, a second terminal coupled to the second terminal of the first offset capacitor, and a control terminal receiving the third control signal; and an eighth switch, having a first terminal coupled to the second terminal of the first offset capacitor, a second terminal coupled to the negative input terminal of the fully differential amplifier, and a control terminal receiving the fourth control signal, wherein the first control signal, the second control signal, the third control signal and the fourth control signal are operated in an operation cycle, and wherein the first offset capacitor is used to store charges opposite to the first CUT, and wherein the capacitance of the first offset capacitor is arbitrarily set to a first value and then the output voltage of the fully differential amplifier can be obtained based on a difference of the first value and a capacitance of the CUT, wherein the capacitance of the first offset capacitor is modified according to the output voltage of the fully differential amplifier so as to make the output voltage of the fully differential amplifier substantially equal to zero.

2. The capacitor interface circuit according to claim 1, further comprising: a control unit, coupled to the control terminals of the first through the eighth switches, for generating the first, the second, the third and the fourth control signals in sequence during the operation cycle of the capacitor interface circuit.

3. The capacitor interface circuit according to claim 2, wherein the control unit is further coupled to the control terminals of the first and the second reset switches for generating the reset signal during every N operation cycles of the capacitor interface circuit, where N is a positive integer which is larger than or equal to 1.

4. The capacitor interface circuit according to claim 1, further comprising: a control unit, coupled to the control terminals of the first through the eighth switches, for generating the third, the fourth, the first and the second control signals in sequence during the operation cycle of the capacitor interface circuit.

5. The capacitor interface circuit according to claim 4, wherein the control unit is further coupled to the control terminals of the first and the second reset switches for generating the reset signal during every N operation cycles of the capacitor interface circuit, where N is a positive integer which is larger than or equal to 1.

6. The capacitor interface circuit according to claim 1, further comprising:

a second CUT, having a first terminal coupled to the reference voltage;

a ninth switch, having a first terminal receiving the positive reference voltage, a second terminal coupled to a second terminal of the second CUT, and a control terminal receiving the first control signal;

a tenth switch, having a first terminal coupled to the second terminal of the second CUT, a second terminal coupled to the negative input terminal of the fully differential amplifier, and a control terminal receiving the second control signal;

a eleventh switch, having a first terminal receiving the negative reference voltage, a second terminal coupled to the second terminal of the second CUT, and a control terminal receiving the third control signal;

a twelfth switch, having a first terminal coupled to the second terminal of the second CUT, a second terminal coupled to the positive input terminal of the fully differential amplifier, and a control terminal receiving the fourth control signal;

a second offset capacitor, having a first terminal coupled to the reference voltage;

a thirteenth switch, having a first terminal receiving the negative reference voltage, a second terminal coupled to a second terminal of the second offset capacitor, and a control terminal receiving the first control signal;

a fourteenth switch, having a first terminal coupled to the second terminal of the second offset capacitor, a second terminal coupled to the negative input terminal of the fully differential amplifier, and a control terminal receiving the second control signal;

a fifteenth switch, having a first terminal receiving the positive reference voltage, a second terminal coupled to the second terminal of the second offset capacitor, and a control terminal receiving the third control signal; and a sixteenth switch, having a first terminal coupled to the second terminal of the second offset capacitor, a second terminal coupled to the positive input terminal of the fully differential amplifier, and a control terminal receiving the fourth control signal.

7. The capacitor interface circuit according to claim 1, further comprising:

a ninth switch, having a first terminal coupled to the second terminal of the second switch, a second terminal coupled to the positive input terminal of the fully differential amplifier, and a control terminal receiving a fifth control signal;

a tenth switch, having a first terminal coupled to the second terminal of the fourth switch, a second terminal coupled to the negative input terminal of the fully differential amplifier, and a control terminal receiving the fifth control signal;

a eleventh switch, having a first terminal coupled to the second terminal of the second switch, a second terminal coupled to the second terminal of the tenth switch, and a control terminal receiving a sixth control signal;

a twelfth switch, having a first terminal coupled to the second terminal of the fourth switch, a second terminal coupled to the second terminal of the ninth switch, and a control terminal receiving the sixth control signal;

a thirteenth switch, having a first terminal coupled to the negative output terminal of the fully differential amplifier, a second terminal coupled to the second terminal of the first feedback capacitor, and a control terminal receiving the fifth control signal;

a fourteenth switch, having a first terminal coupled to the positive output terminal of the fully differential amplifier, a second terminal coupled to the second terminal of the second feedback capacitor, and a control terminal receiving the fifth control signal;

a fifteenth switch, having a first terminal coupled to the first terminal of the thirteenth switch, a second terminal coupled to the second terminal of the fourteenth switch, and a control terminal receiving the sixth control signal; and a sixteenth switch, having a first terminal coupled to the first terminal of the fourteenth switch, a second terminal coupled to the second terminal of the thirteenth switch, and a control terminal receiving the sixth control signal.

8. The capacitor interface circuit according to claim 7, further comprising: a control unit, coupled to the control terminals of the first through the eighth switches, for generating the first, the second, the third and the fourth control signals in sequence during the operation cycle of the capacitor interface circuit.

9. The capacitor interface circuit according to claim 8, wherein the control unit is further coupled to the control terminals of the first and the second reset switches for generating the reset signal during every N operation cycles of the capacitor interface circuit, where N is a positive integer which is larger than or equal to 1.

10. The capacitor interface circuit according to claim 9, wherein the control unit is further coupled to the control terminals of the ninth through the sixteenth switches for generating the fifth and the sixth control signals in sequence during the operation cycle of the capacitor interface circuit.

11. The capacitor interface circuit according to claim 10, wherein the fifth control signal is enabled during either the first or the second control signals is enabled, and the fifth control signal is disabled during either the third or the fourth control signals is enabled.

12. The capacitor interface circuit according to claim 11, wherein the sixth control signal is disabled during either the first or the second control signals is enabled, and the sixth control signal is enabled during either the third or the fourth control signals is enabled.

13. The capacitor interface circuit according to claim 7, further comprising:

a second CUT, having a first terminal coupled to the reference voltage;

a seventeenth switch, having a first terminal receiving the positive reference voltage, a second terminal coupled to a second terminal of the second CUT, and a control terminal receiving the first control signal;

a eighteenth switch, having a first terminal coupled to the second terminal of the second CUT, a second terminal coupled to the first terminal of the twelfth switch, and a control terminal receiving the second control signal;

a nineteenth switch, having a first terminal receiving the negative reference voltage, a second terminal coupled to the second terminal of the second CUT, and a control terminal receiving the third control signal;

a twentieth switch, having a first terminal coupled to the second terminal of the second CUT, a second terminal coupled to the first terminal of the eleventh switch, and a control terminal receiving the fourth control signal; a second offset capacitor, having a first terminal coupled to the reference voltage;

a twenty-first switch, having a first terminal receiving the negative reference voltage, a second terminal coupled to a second terminal of the second offset capacitor, and a control terminal receiving the first control signal;

a twenty-second switch, having a first terminal coupled to the second terminal of the second offset capacitor, a second terminal coupled to the first terminal of the twelfth switch, and a control terminal receiving the second control signal;

a twenty-third switch, having a first terminal receiving the positive reference voltage, a second terminal coupled to the second terminal of the second offset capacitor, and a control terminal receiving the third control signal; and a twenty-fourth switch, having a first terminal coupled to the second terminal of the second offset capacitor, a second terminal coupled to the first terminal of the eleventh switch, and a control terminal receiving the fourth control signal.

14. The capacitor interface circuit according to claim 13, further comprising: a control unit, coupled to the control terminals of the first through the eighth and the seventh through the twenty-fourth switches, for generating the first, the second, the third and the fourth control signals in sequence during the operation cycle of the capacitor interface circuit.

* * * * *